(12) United States Patent
Kato et al.

(10) Patent No.: US 9,702,055 B2
(45) Date of Patent: Jul. 11, 2017

(54) METHOD FOR MANUFACTURING SINGLE-CRYSTAL SILICON

(75) Inventors: Hideo Kato, Gifu (JP); Shinichi Kyufu, Yamaguchi (JP)

(73) Assignee: SILTRONIC AG, Munich (DE)

( * ) Notice: Subject to any disclaimer, the term of this patent is extended or adjusted under 35 U.S.C. 154(b) by 339 days.

(21) Appl. No.: 14/362,368

(22) PCT Filed: Jul. 10, 2012

(86) PCT No.: PCT/EP2012/063494
§ 371 (c)(1),
(2), (4) Date: Jun. 2, 2014

(87) PCT Pub. No.: WO2013/097953
PCT Pub. Date: Jul. 4, 2013

(65) Prior Publication Data
US 2015/0040820 A1 Feb. 12, 2015

(30) Foreign Application Priority Data
Dec. 26, 2011 (JP) ................................. 2011-283330

(51) Int. Cl.
*C30B 15/10* (2006.01)
*C30B 15/02* (2006.01)
*C30B 15/22* (2006.01)
*C30B 29/06* (2006.01)
*C30B 35/00* (2006.01)

(52) U.S. Cl.
CPC .............. *C30B 15/02* (2013.01); *C30B 15/10* (2013.01); *C30B 15/22* (2013.01); *C30B 29/06* (2013.01); *C30B 35/002* (2013.01)

(58) Field of Classification Search
CPC ........ C30B 15/002; C30B 15/02; C30B 15/10
See application file for complete search history.

(56) References Cited

U.S. PATENT DOCUMENTS

| 2001/0032580 | A1 | 10/2001 | Phillips et al. |
| 2002/0166499 | A1 | 11/2002 | Kimura |
| 2003/0106491 | A1* | 6/2003 | Kemmochi ........... C03B 19/095 117/200 |
| 2004/0072007 | A1* | 4/2004 | Kemmochi ............... B32B 5/16 428/544 |
| 2007/0051297 | A1 | 3/2007 | Kemmochi et al. |
| 2011/0143063 | A1 | 6/2011 | Yamagata et al. |
| 2012/0006254 | A1 | 1/2012 | Fujishiro et al. |

FOREIGN PATENT DOCUMENTS

| CN | 1343265 A | 4/2002 |
| CN | 102224113 A | 10/2011 |
| EP | 0748885 A1 | 12/1996 |
| EP | 1076120 A1 | 2/2001 |
| EP | 1348782 A2 | 10/2003 |
| JP | 09-110590 A | 4/1997 |

(Continued)

*Primary Examiner* — Robert M Kunemund
(74) *Attorney, Agent, or Firm* — Brooks Kushman P.C.

(57) ABSTRACT

The success rate of multi-pulled single crystal growth by the Czochralski method is enhanced by the use of a melt crucible having an amount of barium on an inner surface thereof which varies inversely with the diameter of the crucible. At least one single crystal is separated from the melt by a free span method.

7 Claims, 7 Drawing Sheets

(56) References Cited

FOREIGN PATENT DOCUMENTS

| | | | |
|---|---|---|---|
| JP | 2003160393 | A | 6/2003 |
| JP | 2005145731 | A | 6/2005 |
| JP | 2007001793 | A | 1/2007 |
| JP | 2007176761 | A | 7/2007 |
| JP | 2008081398 | A | 4/2008 |
| JP | 2010030867 | A | 2/2010 |
| JP | 2010184819 | A | 8/2010 |
| KR | 10-2001-0042835 | A | 5/2001 |
| WO | 01/63023 | A1 | 8/2001 |
| WO | 0214587 | A1 | 2/2002 |

* cited by examiner

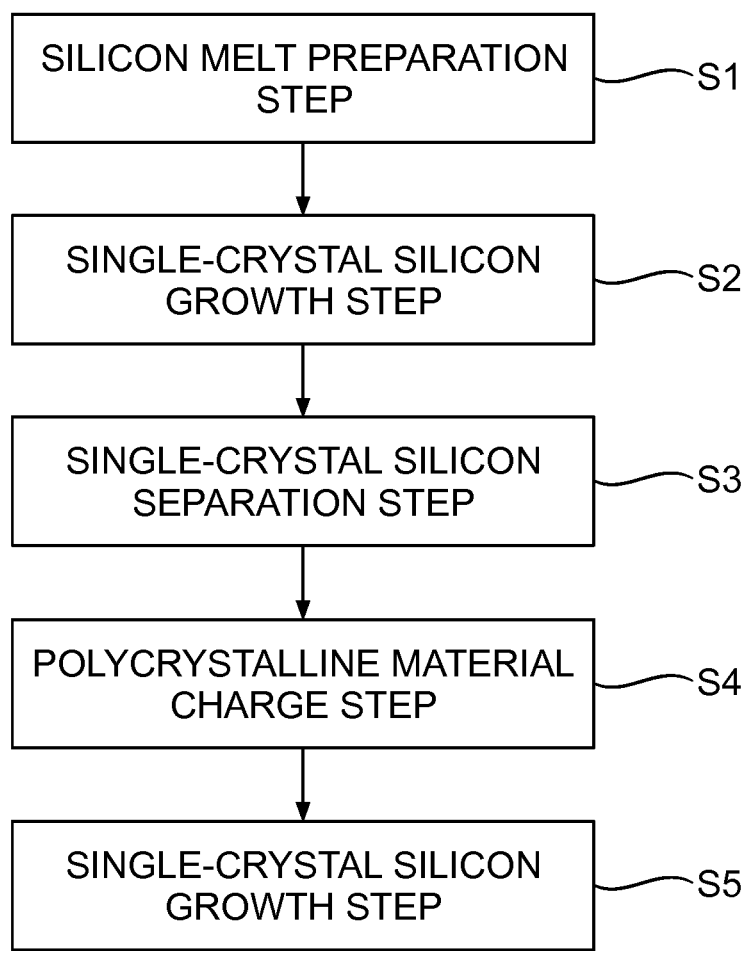

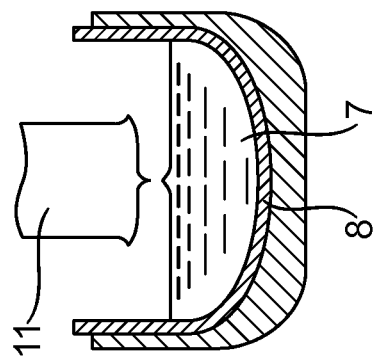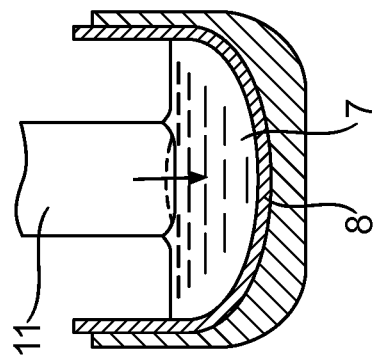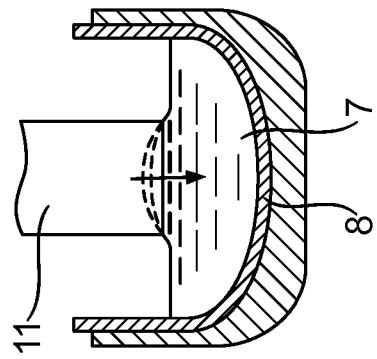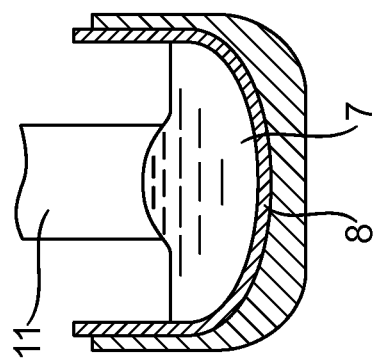

METHOD FOR MANUFACTURING SINGLE-CRYSTAL SILICON

CROSS-REFERENCE TO RELATED APPLICATIONS

This application is the U.S. National Phase of PCT Appln. No. PCT/EP2012/063494 filed Jul. 10, 2012, which claims priority to Japanese Application No. JP2011-283330 filed Dec. 26, 2011, the disclosures of which are incorporated in their entirety by reference herein.

BACKGROUND OF THE INVENTION

1. Technical Field

The present invention relates to a method for manufacturing single-crystal silicon, and particularly to a method for manufacturing single-crystal silicon manufactured by a Czochralski method.

2. Description of the Related Art

The Czochralski method has been widely used in the manufacture of single-crystal silicon. In the Czochralski method, a polycrystalline material is melted in a quartz crucible, and a seed crystal is brought into contact with a material melt and is pulled up, thereby growing the single-crystal silicon.

Dislocation of the single-crystal silicon occurs in some cases during growth of the single-crystal silicon. It is pointed out that one of the reasons for dislocation of the single-crystal silicon is that cristobalite precipitated on an inner surface of the crucible made of quartz glass is released into the silicon melt and the cristobalite is taken into a silicon ingot when the silicon is pulled up.

Japanese Patent Laid-Open Application No. 9-110590 describes a method for promoting crystallization of quartz and preventing release of cristobalite by adhering a devitrification promoter containing an alkaline-earth metal such as barium to an inner surface of a quartz crucible.

Japanese Patent Laid-Open Application No. 2003-160393 describes a method for reducing occurrence of dislocation during growth of single-crystal silicon by decreasing the concentration of a devitrification promoter, which is adhered to an inner surface of a quartz crucible, at a portion where the temperature during pulling-up of the single-crystal silicon is high, and increasing the concentration of the devitrification promoter at a portion where the temperature is low.

In recent years, single-crystal silicon has been manufactured using a multi-pulling method for pulling up a plurality of pieces of single-crystal silicon from a material melt in an identical crucible. According to this method, a single crystal is pulled up from the material melt, and then, a polycrystalline material is additionally charged into and melted in the remaining material melt without turning off a heater, and then, a next single crystal is pulled up. By repeating these steps of additionally charging the polycrystalline material into the material melt and melting the polycrystalline material in the material melt, and then, pulling up a next single crystal, a plurality of pieces of single-crystal silicon is pulled up using the identical crucible.

When the plurality of silicon single crystals are pulled up in the identical crucible using the above-mentioned multi-pulling method, the operation takes a long time, and thus, the crucible is also exposed to high temperature for a long time. Even if a crucible having a denitrification promoter containing barium adhered thereto is used in the manufacture of the single-crystal silicon by the multi-pulling method, dislocation occurs in some cases when the single-crystal silicon is separated from the material melt.

The present invention has been made in view of the above-mentioned problems, and an object of the present invention is to provide a method for manufacturing single-crystal silicon that makes it possible to reduce occurrence of dislocation of the single-crystal silicon when the single-crystal silicon is grown using the multi-pulling method for pulling up a plurality of pieces of single-crystal silicon from a material melt in an identical crucible.

As a result of earnest study, the inventors of the present invention have found that occurrence of dislocation of single-crystal silicon is affected by an amount (dose amount) of added barium on an inner wall surface of a crucible. When the amount (dose amount) of added barium is large, the rate of occurrence of dislocation of the single-crystal silicon is high. On the other hand, when the amount (dose amount) of added barium is small, the rate of occurrence of dislocation of the single-crystal silicon is low. When the amount (dose amount) of added barium becomes smaller than a certain amount (dose amount), the rate of occurrence of dislocation of the single-crystal silicon becomes high.

The reason why the rate of occurrence of dislocation of the single-crystal silicon is high when the amount (dose amount) of added barium is large is considered as follows. First, cristobalite is produced on the surface of the quartz crucible by a denitrification promoter adhered to the surface of the crucible and containing barium. When single-crystal silicon is pulled up to a certain length from the silicon melt, and then, the single-crystal silicon is separated, silicon solidifies before cristobalite released into the silicon melt flows down from a tail part to the silicon melt, and the cristobalite is taken into the silicon as an impurity. As a result, dislocation occurs in the single-crystal silicon and the silicon is dislocated.

On the other hand, when the amount (dose amount) of added barium is extremely small, the rate of occurrence of dislocation of the single-crystal silicon is high. One of the reasons for this is considered as follows. When the amount (dose amount) of added barium is small, uniform crystallization of quartz on the inner wall of the crucible is not achieved, and thus, the cristobalite is released into the silicon melt and taken into the single-crystal silicon.

When the crucible has a large size, the temperature of the crucible during growth of the single-crystal silicon is high. High temperature of the crucible promotes crystallization. Therefore, the amount of barium melted into the silicon melt varies depending on the size of the crucible.

SUMMARY OF THE INVENTION

The present invention has been made based on the above-mentioned findings. A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method, the method having the following steps. The material melt is prepared in the crucible having a diameter of 18 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, at least a part of formation of a tail part of the single-crystal silicon is omitted and the single-crystal silicon is separated from the material melt. A layer containing barium is formed on an inner wall of the crucible, and an amount of the barium added is $1.4 \times 10^{16}$ atoms·cm$^{-2}$ or more and $5.4 \times 10^{16}$ atoms·cm$^{-2}$ or less.

The amount of added barium herein refers to an amount of added barium on the inner surface of the crucible per unit area. The layer containing barium may be a layer of barium alone or a layer of a barium compound such as barium carbonate or barium hydroxide. Furthermore, the layer containing barium may be a barium-rich layer obtained by injecting barium onto the surface of the crucible.

A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method. The material melt is prepared in the crucible having a diameter of 24 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, at least a part of formation of a tail part of the single-crystal silicon is omitted and the single-crystal silicon is separated from the material melt. A layer containing barium is formed on an inner wall of the crucible, and an amount of the barium added is $5.4 \times 10^{15}$ atoms·cm$^{-2}$ or more and $2.7 \times 10^{16}$ atoms·cm$^{-2}$ or less.

A method for manufacturing single-crystal silicon according to the present invention is directed to a method for manufacturing single-crystal silicon using a multi-pulling method for pulling up a plurality of pieces of single-crystal silicon from a material melt in an identical crucible within a chamber by a Czochralski method, the method having the following steps. The material melt is prepared in the crucible having a diameter of 32 inches. Single-crystal silicon is pulled up from the material melt. A polycrystalline material is additionally charged into and melted in the remaining material melt while continuing heating of the material melt. Next single-crystal silicon is pulled up from the material melt having the polycrystalline material additionally charged and melted therein. The step of additionally charging and melting the polycrystalline material and the step of pulling up next single-crystal silicon are repeated one or more times. In at least one of the step of pulling up single-crystal silicon and the step of pulling up next single-crystal silicon, which is repeated one or more times, at least a part of formation of a tail part of the single-crystal silicon is omitted and the single-crystal silicon is separated from the material melt. A layer containing barium is formed on an inner wall of the crucible, and an amount of the barium added is $1.4 \times 10^{15}$ atoms·cm$^{-2}$ or more and $5.4 \times 10^{15}$ atoms·cm$^{-2}$ or less.

In the method for manufacturing single-crystal silicon according to the present invention, there can be reduced occurrence of dislocation of the single-crystal silicon when the single-crystal silicon is grown using the multi-pulling method for pulling up a plurality of pieces of single-crystal silicon from a material melt in an identical crucible.

BRIEF DESCRIPTION OF THE DRAWINGS

FIG. 3 is a flowchart showing a method for manufacturing single-crystal silicon according to the invention.

FIGS. 4(*a*) to (*d*) are explanatory views showing a process of change in shape of a growth face of the single-crystal silicon.

DETAILED DESCRIPTION OF THE PREFERRED EMBODIMENTS

Figure 1:
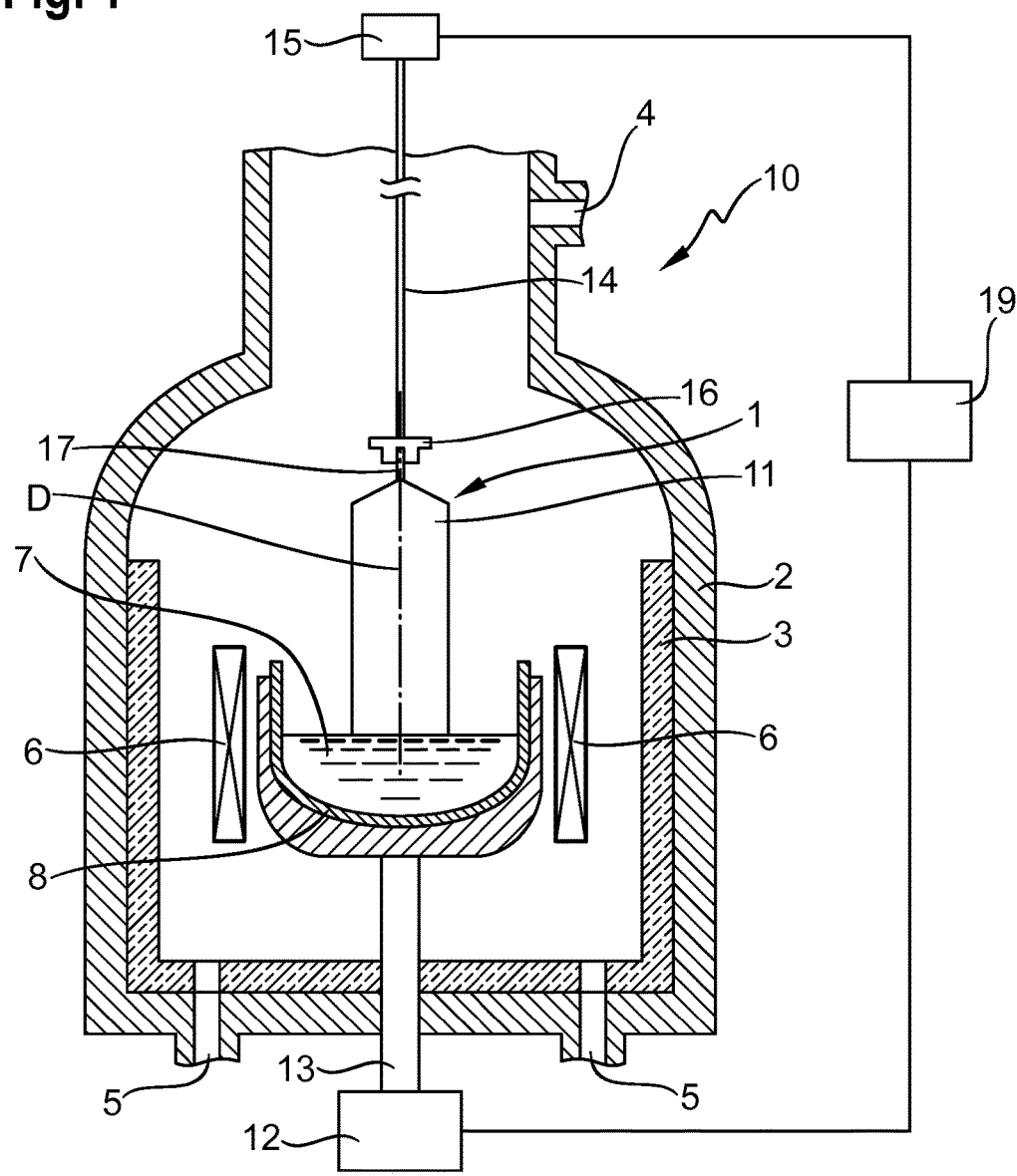
FIG. 1 is a schematic view showing a single-crystal silicon manufacturing device according to one embodiment of the invention.

An embodiment of the present invention will be described hereinafter with reference to the drawings, in which the same or corresponding portions are denoted by the same reference characters and description thereof will not be repeated.

First, a manufacturing device for manufacturing single-crystal silicon according to the present embodiment will be described with reference to FIG. 1.

As shown in FIG. 1, a single-crystal silicon manufacturing device 10 mainly has a chamber 2, a heater 6, a crucible 8, a crucible supporting shaft 13, and a pulling-up wire 14. An inner wall of chamber 2 is provided with a heat insulating material 3. An inlet 4 through which an inert gas such as argon (Ar) is introduced is provided in the upper portion of chamber 2, and an outlet 5 through which the gas in chamber 2 is discharged is provided at the bottom of chamber 2. Crucible 8 is filled with solid silicon material to form a silicon melt 7. Heater 6 is provided around crucible 8 to melt the solid silicon material, and thereby the silicon melt 7 can be fabricated. Crucible supporting shaft 13 extends from a lower end of crucible 8 toward the bottom of the chamber and is rotatably supported by a crucible supporting shaft drive device 12. Crucible 8 can be moved up and down by crucible supporting shaft drive device 12. Pulling-up wire 14 is for pulling up single-crystal silicon 1, and can be moved up and down by a pulling-up wire drive device 15. Crucible supporting shaft drive device 12 and pulling-up wire drive device 15 are controlled by a control device 19. A layer containing barium is formed on the inner wall of the crucible and may be a layer of barium alone or a layer of a barium compound such as barium carbonate.

Figure 2:
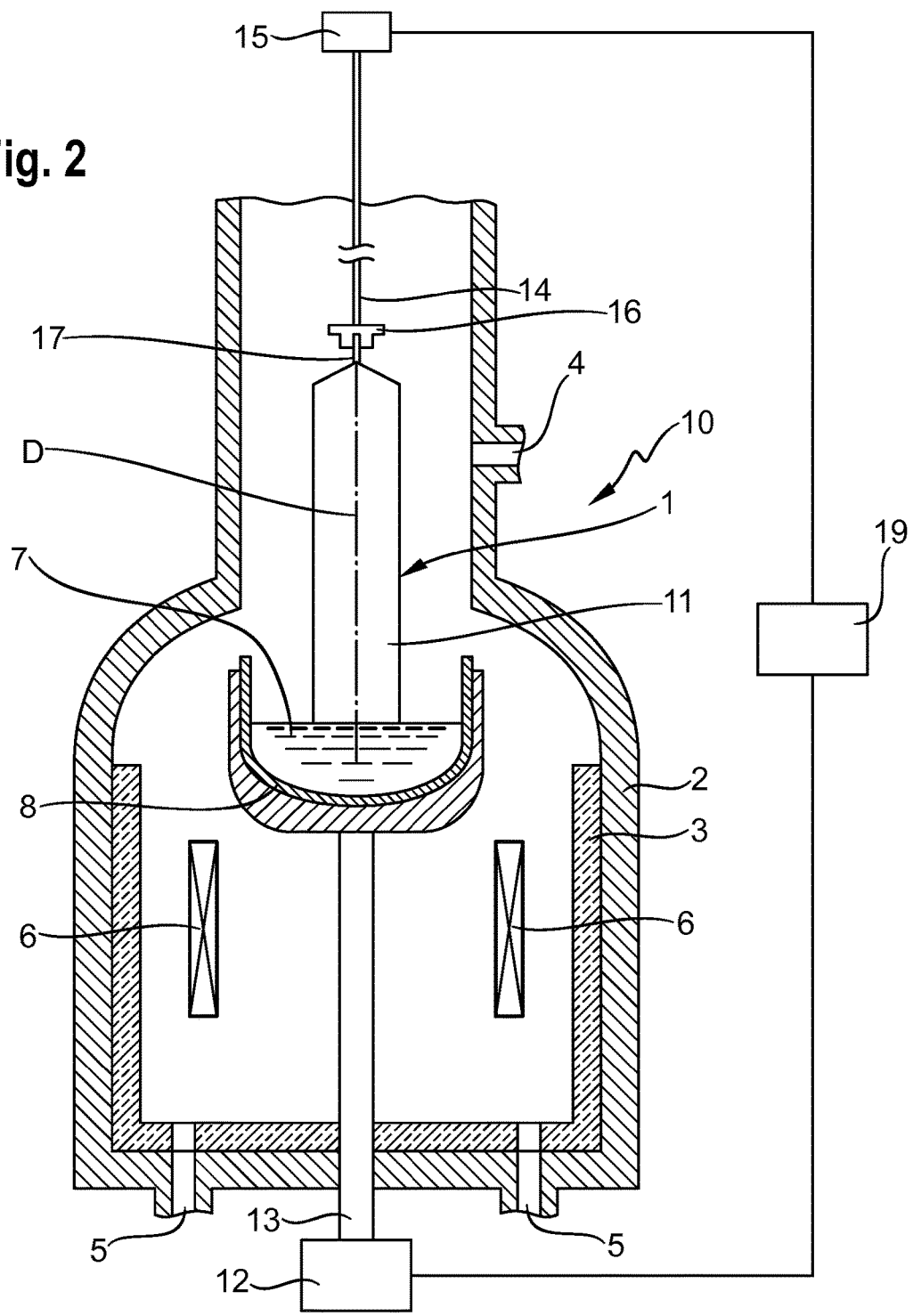
FIG. 2 is a schematic view showing one example of an operating state of the single-crystal silicon manufacturing device according to one embodiment of the invention.

Next, a method for manufacturing single-crystal silicon according to the present embodiment will be described with reference to FIGS. 1 to 3.

As shown in FIG. 3, the method for manufacturing single-crystal silicon according to the present embodiment is directed to a method for manufacturing single-crystal silicon using the multi-pulling method for pulling up a plurality of pieces of single-crystal silicon from a material melt in an identical crucible within a chamber by the Czochralski method, and mainly has a silicon melt preparation step S1, a single-crystal silicon growth step S2, a single-crystal silicon separation step S3, a polycrystalline material charge step S4, and a single-crystal silicon growth step S5.

In silicon melt preparation step S1, crucible 8 is filled with the solid silicon material, which is heated by heater 6 in order to melt the solid silicon material. Crucible 8 has a diameter of, for example, 18 inches, 24 inches, 32 inches, 40 inches and the like. The layer containing barium is formed on the inner wall of crucible 8. An amount (dose amount) of added barium varies depending on the size of crucible 8.

The amount of added barium when the crucible has a diameter of 18 inches is $1.4 \times 10^{16}$ atoms·cm$^2$ or more and $5.4 \times 10^{16}$ atoms·cm$^2$ or less. The amount of added barium when the crucible has a diameter of 24 inches is $5.4 \times 10^{15}$ atoms·cm$^2$ or more and $2.7 \times 10^{16}$ atoms·cm$^2$ or less. The amount of added barium when the crucible has a diameter of 32 inches is $1.4 \times 10^{15}$ atoms·cm$^2$ or more and $5.4 \times 10^{15}$ atoms·cm$^2$ or less.

In single-crystal silicon growth step S2, a seed crystal 17 attached to a seed chuck 16 is first moved down to the surface of silicon melt 7 and immersed in silicon melt 7. Thereafter, pulling-up wire 14 is wound up by pulling-up wire drive device 15 to pull up single-crystal silicon 1. After single-crystal silicon 1 attains a target diameter through growth of a cone part (extended part), a straight part 11 is grown to have a predetermined length.

In single-crystal silicon separation step S3, straight part 11 is first grown to have the predetermined length, and then, winding-up of pulling-up wire 14 is stopped. Thereafter, crucible 8 is moved down to separate single-crystal silicon 1 from silicon melt 7. Although there are various methods as a method for separating the single-crystal silicon, it is preferable to separate the single-crystal silicon such that a tail part thereof is as short as possible, from the viewpoint of enhancing the yield. There is a method called "free span method (tail-coneless method)" as a method for separating the single-crystal silicon to achieve the short tail part. According to the free span method, when the length of the straight part reaches the predetermined length in pulling-up of single-crystal silicon 1, the crucible supporting shaft drive device starts moving up crucible 8. As shown in FIG. 2, the speed of moving up crucible 8 is set to be the same as the speed of moving up single-crystal silicon 1, and single-crystal silicon 1 and crucible 8 are moved up. When crucible 8 reaches a predetermined height, moving-up of crucible 8 by crucible supporting shaft drive device 12 and winding-up of pulling-up wire 14 are stopped. Thereafter, crucible supporting shaft drive device 12 causes crucible 8 to move down to separate single-crystal silicon 1 from silicon melt 7. With the above-mentioned method, single-crystal silicon 1 can be separated while minimizing formation of the tail part.

Next, polycrystalline material charge step S4 is performed. In the polycrystalline material charge step, after single-crystal silicon 1 is separated from silicon melt 7, a polycrystalline material is additionally charged through a not-shown supply port into silicon melt 7 remaining in crucible 8, and the polycrystalline material is melted. When the polycrystalline material is additionally charged, heater 6 heating crucible 8 is not turned off. As a result, the polycrystalline material is charged into crucible 8 while continuing heating of crucible 8.

Next, single-crystal silicon growth step S5 is performed. In this step, next single-crystal silicon 1 is pulled up from the material melt (silicon melt 7) having the polycrystalline material additionally charged and melted therein. When straight part 11 reaches the predetermined length, single-crystal silicon 1 is separated from silicon melt 7.

The single-crystal silicon separation step, the step of additionally charging and melting the polycrystalline material, and the step of pulling up the next single-crystal silicon are repeated one or more times. As a result, a plurality of pieces of single-crystal silicon 1 can be pulled up. At least one of the steps of pulling up the plurality of pieces of single-crystal silicon 1 may include a step of omitting at least a part of formation of the tail part of single-crystal silicon 1 and separating single-crystal silicon 1 from the material melt (silicon melt 7). Omission of at least a part of formation of the tail part also includes the case of separating the single-crystal silicon by the free span method after partially forming the tail part.

With reference to FIG. 4, description will be given to a process of change in shape of a growth face (interface with the material melt) of single-crystal silicon 1 when single-crystal silicon 1 is separated by the free span method. As shown in FIG. 4($a$), the growth face of single-crystal silicon 1 during growth of straight part 11 has an upwardly convex shape. When crucible 8 starts moving up at the same speed as the pulling rate of single-crystal silicon 1, pulling-up of single-crystal silicon 1 stops substantially (the relative movement of crucible 8 and single-crystal silicon 1 in the vertical direction stops). Therefore, the upwardly convex shape of the growth face of single-crystal silicon 1 is gradually relieved as shown in FIG. 4($b$). After this substantially stopped state is maintained for a predetermined time period, the shape of the growth face of single-crystal silicon 1 changes into a downwardly convex shape as shown in FIG. 4($c$). By separating single-crystal silicon 1 from silicon melt 7 with the growth face of single-crystal silicon 1 having the downwardly convex shape, separation is achieved while minimizing bubbling of silicon melt 7 (FIG. 4($d$)). As a result, single-crystal silicon 1 can be separated from silicon melt 7 while maintaining single-crystal silicon 1 in the dislocation-free state and minimizing the length of the tail.

In the free span method, crucible 8 containing silicon melt 7 is moved up at the same speed as the pulling rate of single-crystal silicon 1 during growth. As a result, pulling-up of single-crystal silicon 1 is substantially stopped without considerable change in heat history of single-crystal silicon 1, and in this state, single-crystal silicon 1 is separated from silicon melt 7. Consequently, a lower end face (i.e., interface with silicon melt 7) of single-crystal silicon 1 can have the downwardly convex shape, and the single-crystal silicon can be separated from silicon melt 7 with the single-crystal silicon maintained in the dislocation-free state.

Figure 5:
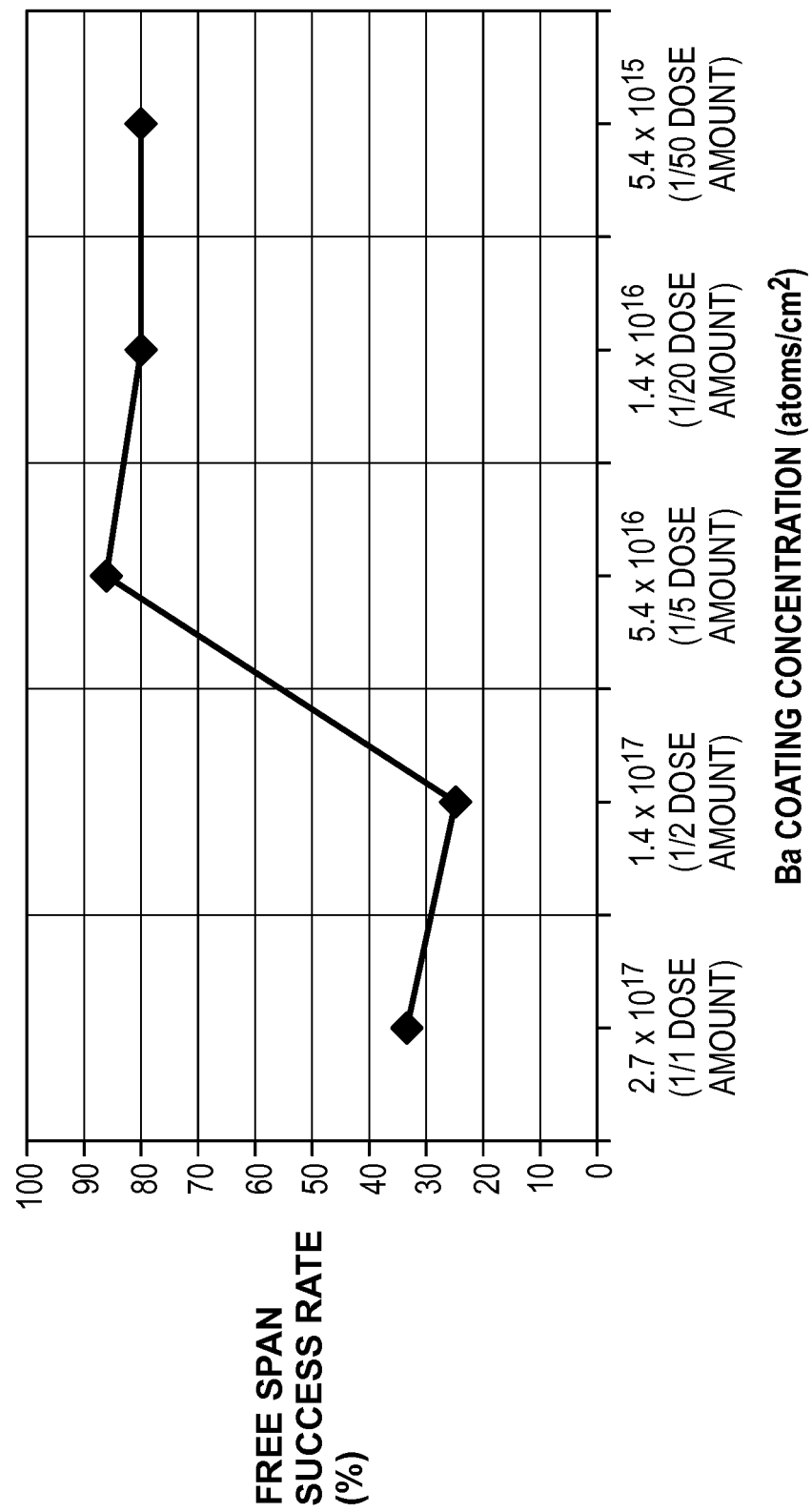
FIG. 5 shows a relationship between a free span success rate and a dose amount of barium.

With reference to FIG. 5, description will be given to a relationship between a free span success rate when single-crystal silicon 1 is pulled up and an amount (dose amount) of addition of barium formed on the inner wall of 18-inch crucible 8. The vertical axis indicates the free span success rate and the horizontal axis indicates the concentration of barium coating. The free span success rate refers to a ratio between the number of pulling-up of single-crystal silicon 1 and the number of pulling-up of single-crystal silicon 1 without dislocation by the free span method. In order to obtain the data, pulling-up of five pieces of single-crystal silicon 1 by the multi-pulling method is carried out ten times. The barium is added by spraying a barium hydroxide aqueous solution on the inner wall of crucible 8. As shown in FIG. 5, when the amount (dose amount) of added barium is $1.4 \times 10^{17}$ atoms·cm$^{-2}$ or more, the free span success rate is 40% or less. On the other hand, when the amount (dose amount) of added barium is $5.4 \times 10^{16}$ atoms·cm$^{-2}$ or less, the free span success rate is approximately 90% or more. One of the reasons why the free span success rate is low when the amount (dose amount) of added barium is large is considered as follows. The barium is dissolved in silicon melt 7, and the barium melted into silicon melt 7 is taken into the silicon when single-crystal silicon 1 is pulled up, thereby dislocating the silicon.

Figure 6:
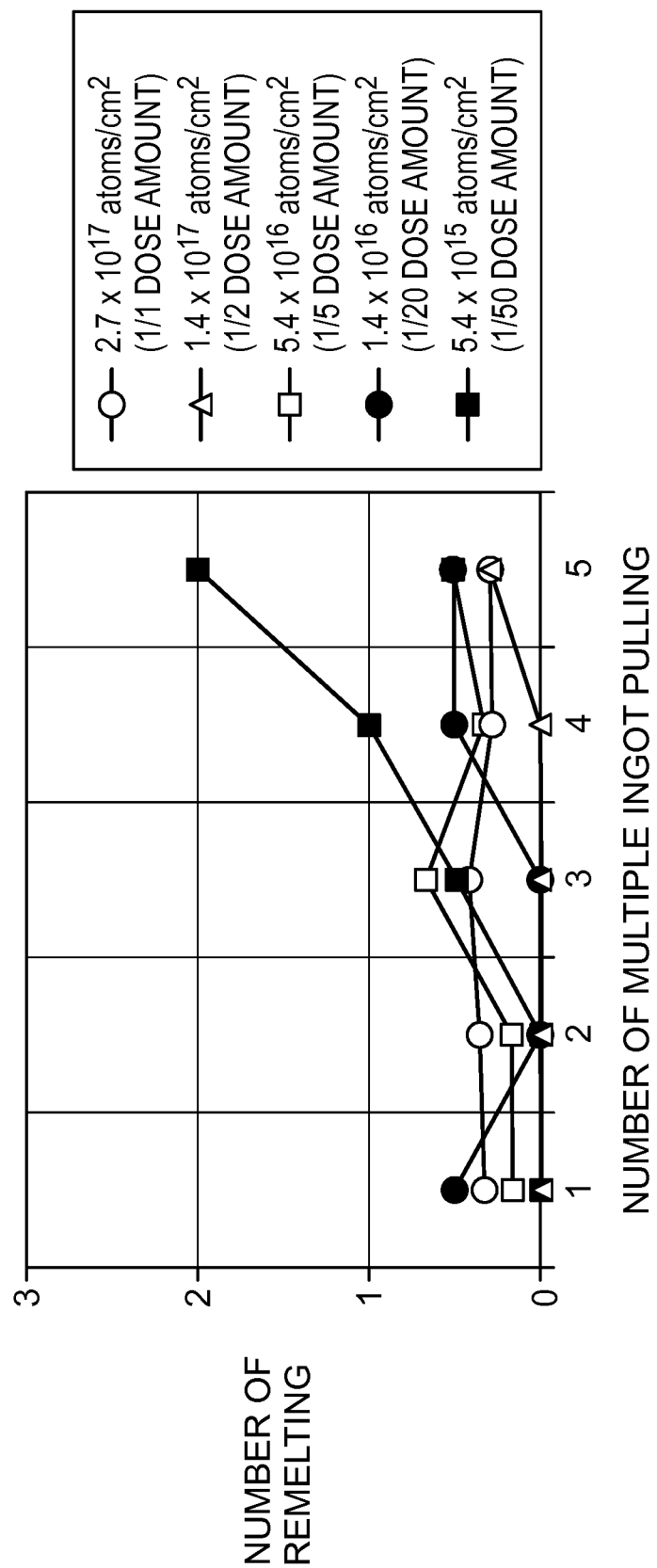
FIG. 6 shows a relationship between the number of remelting and the number of pulled-up silicon ingots.

With reference to FIG. 6, description will be given to a relationship between the number of remelting and the number of pulled-up silicon ingots. The vertical axis indicates the number of remelting and the horizontal axis indicates the number of pulled-up ingots. Data indicated by a white circle is data when the concentration (dose amount) of barium coating is $2.7 \times 10^{17}$ atoms/cm$^2$. Data indicated by a white triangle is data when the concentration (dose amount) of barium coating is $1.4 \times 10^{17}$ atoms/cm$^2$. Data indicated by a white square is data when the concentration (dose amount) of barium coating is $5.4 \times 10^{16}$ atoms/cm$^2$. Data indicated by a black circle is data when the concentration (dose amount) of barium coating is $1.4 \times 10^{16}$ atoms/cm$^2$. Data indicated by a black square is data when the concentration (dose amount) of barium coating is $5.4 \times 10^{15}$ atoms/cm$^2$. If single-crystal silicon 1 is dislocated during pulling-up of single-crystal silicon 1, dislocated single-crystal silicon 1 is moved down and again melted into silicon melt 7. Thereafter, pulling-up of single-crystal silicon 1 is restarted. The number of remelting refers to the average number of remelting single-crystal silicon 1 into silicon melt 7 when single-crystal silicon 1 is dislocated. The number of pulled-up ingots refers to the number of pulled-up ingots when a plurality of pieces of single-crystal silicon 1 is pulled up using the multi-pulling method.

Referring to FIG. 6, when the amount (dose amount) of added barium is $1.4 \times 10^{16}$ atoms·cm$^{-2}$ or more, the number of remelting remain nearly unchanged even when the number of pulled-up ingots is five. However, when the amount (dose amount) of added barium is $5.4 \times 10^{15}$ atoms·cm$^{-2}$ or less, the number of remelting increases as the number of pulled-up ingots increases. As the number of remelting increases, the operation time becomes longer, which leads to an extreme decrease in productivity. Therefore, in view of productivity and heat load to crucible 8, the amount of added barium is desirably $1.4 \times 10^{16}$ atoms·cm$^{-2}$ or more.

Figure 7:
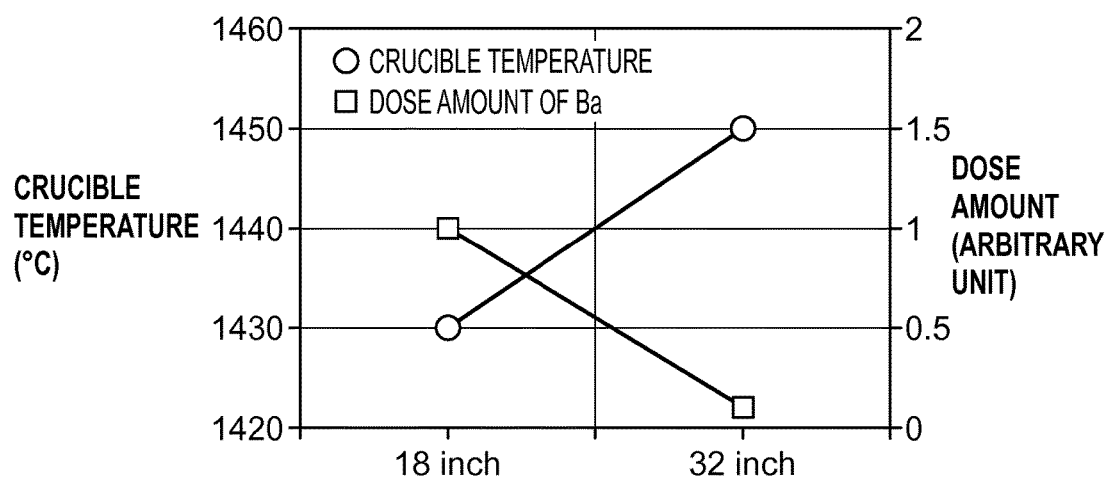
FIG. 7 shows a relationship between a temperature of a crucible and a size of the crucible as well as a relationship between a dose amount of barium and a size of the crucible.

With reference to FIG. 7, description will be given to a relationship between the temperature of crucible 8 and the size of crucible 8 as well as a relationship between the dose amount of barium and the size of crucible 8. The vertical axis on the left indicates the temperature of crucible 8 and the vertical axis on the right indicates the dose amount of barium. The horizontal axis indicates the diameter of crucible 8. When large-size crucible 8 is used, the temperature of crucible 8 must be raised in order to maintain the state of silicon melt 7 in crucible 8 under the condition similar to that when small-size crucible 8 is used. High temperature of crucible 8 promotes crystallization of the barium adhered to the inner wall of crucible 8. As crystallization of the barium is promoted, the amount of the barium melted into silicon melt 7 decreases. Therefore, an optimum amount (dose amount) of added barium varies depending on the size of crucible 8. Generally, an amount of change in temperature of crucible 8 is in inverse proportion to a rate of change in optimum amount (dose amount) of added barium. For example, when the temperature of crucible 8 rises by 20° C., the amount (dose amount) of added barium must be decreased by a factor of 10.

As shown in FIG. 7, when the diameter of crucible 8 is changed from 18 inches to 32 inches, the temperature of crucible 8 in pulling-up of single-crystal silicon 1 must be changed from 1430° C. (18 inches) to 1450° C. (32 inches). When the temperature of crucible 8 rises by 20° C., the amount (dose amount) of added barium must be decreased by a factor of 10. The optimum amount of added barium when crucible 8 has a diameter of 18 inches is $1.4 \times 10^{16}$ atoms·cm$^{-2}$ or more and $5.4 \times 10^{16}$ atoms·cm$^{-2}$ or less. Therefore, the optimum amount of added barium when crucible 8 has a diameter of 32 inches is $1.4 \times 10^{15}$ atoms·cm$^{-2}$ or more and $5.4 \times 10^{15}$ atoms·cm$^{-2}$ or less. Similarly, the optimum amount of added barium when crucible 8 has a diameter of 24 inches is $5.4 \times 10^{15}$ atoms·cm$^{-2}$ or more and $2.7 \times 10^{16}$ atoms·cm$^{-2}$ or less.

The dose amount of added barium refers to an amount of barium adhered to or contained on the inner surface of crucible 8 per square centimeter surface area, which is expressed in the number of atoms.

Next, description will be given to a method for forming the layer containing barium on the inner surface of crucible 8.

First, a barium hydroxide aqueous solution, for example, is prepared as the layer containing barium (denitrification promoter). Next, the barium hydroxide aqueous solution is sprayed on quartz crucible 8 heated to 200 to 300° C. The barium hydroxide aqueous solution is applied using a spraying method while rotating crucible 8. An amount of adhering of the layer containing barium can be controlled in accordance with the spraying time and the like.

The layer containing barium may be formed on the inner surface of crucible 8 at a uniform amount of addition, or may be formed at different amounts of addition depending on positions on the inner surface of crucible 8. For example, a large amount of barium may be added at the bottom of crucible 8, and a small amount of barium may be added at a sidewall part and the bottom of crucible 8.

It should be understood that the embodiments disclosed herein are illustrative and not limitative in any respect. The scope of the present invention is defined by the terms of the claims, rather than the embodiments above, and is intended to include any modifications within the scope and meaning equivalent to the terms of the claims.

The invention claimed is:

1. A method for manufacturing single-crystal silicon using a multi-pulling method for sequentially pulling up a plurality of pieces of single-crystal silicon from a material melt in an identical crucible within a chamber by a Czochralski method, the method comprising the steps of:

forming a layer containing barium on an inner wall of a crucible having a nominal diameter of 18 inches or of a crucible having a nominal diameter of 32 inches, wherein the amount of barium is $1.4 \times 10^{16}$ atoms·cm$^{-2}$ or more and $5.4 \times 10^{16}$ atoms·cm$^{-2}$ or less in case the diameter of the crucible is 18 inches, or $1.4 \times 10^{15}$ atoms·cm$^{-2}$ or more and $5.4 \times 10^{15}$ atoms·cm$^{-2}$ or less in case the diameter of the crucible is 32 inches;

selecting one of the crucibles having the nominal diameters of 18 inches or 32 inches;

preparing the material melt in the selected crucible;

pulling up a single-crystal silicon from the material melt;

additionally charging further polycrystalline material into the material melt remaining after pulling up the single-crystal silicon and melting the further polycrystalline material in said material melt while continuing heating of the material melt; and pulling up a next single-crystal silicon from said material melt containing the further polycrystalline material additionally charged and melted therein, wherein the step of additionally charging and melting the polycrystalline material and the step of pulling up a next single-crystal silicon are repeated one or more times, and wherein at least one of the steps of pulling up a single-crystal silicon and pulling up a next single-crystal silicon, which is repeated one or more times, includes a step of omitting at least a part of formation of a tail part of the single-crystal silicon and separating the single-crystal silicon from the material melt.

2. The method for manufacturing single-crystal silicon using a multi-pulling method of claim 1, wherein the layer containing barium is prepared by spraying an aqueous solution of a barium salt onto the inside of the previously formed crucible.

3. The method of claim 2, wherein the crucible is heated to a temperature of from 200 to 300° C. during spraying.

4. The method of claim 2, wherein the aqueous solution of a barium salt is an aqueous solution of barium carbonate or barium hydroxide.

5. The method of claim 2, wherein the aqueous solution of a barium salt is an aqueous solution of barium hydroxide.

6. The method of claim 2, wherein the amount of barium is varied at different portions of the inner crucible walls by varying the amount of the aqueous solution of barium salt sprayed onto the inside of the crucible at different portions of the inner crucible walls.

7. The method of claim 2, wherein the crucible rotates during spraying.

* * * * *